(12) United States Patent
Swaminathan

(10) Patent No.: US 8,918,584 B2
(45) Date of Patent: *Dec. 23, 2014

(54) REFRESH ALGORITHM FOR MEMORIES

(71) Applicant: Micron Technology, Inc., Boise, ID (US)

(72) Inventor: Shuba Swaminathan, San Anselmo, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 14/151,095

(22) Filed: Jan. 9, 2014

(65) Prior Publication Data

US 2014/0122788 A1 May 1, 2014

Related U.S. Application Data

(60) Continuation of application No. 12/976,454, filed on Dec. 22, 2010, now Pat. No. 8,661,192, and a continuation of application No. 11/987,987, filed on Dec. 6, 2007, now Pat. No. 7,870,330, and a division of application No. 11/062,768, filed on Feb. 22, 2005, now Pat. No. 7,325,089, and a continuation of application No. 09/941,763, filed on Aug. 30, 2001, now Pat. No. 6,931,480.

(51) Int. Cl.
| | |
|---|---|
| *G06F 12/00* | (2006.01) |
| *G06F 12/02* | (2006.01) |
| *G11C 16/34* | (2006.01) |
| *G11C 16/16* | (2006.01) |
| *G11C 16/10* | (2006.01) |

(52) U.S. Cl.
CPC .......... *G11C 16/107* (2013.01); *G06F 12/0246* (2013.01); *G11C 16/3427* (2013.01); *G11C 16/3431* (2013.01); *G11C 16/3418* (2013.01); *G11C 16/16* (2013.01)
USPC .......... 711/106; 711/103; 711/156; 711/165; 711/E12.002; 365/185.24; 365/185.29; 365/218; 365/222

(58) Field of Classification Search
CPC .......... G06F 12/0246; G06F 13/1636; G11C 11/406; G11C 11/40611; G11C 11/40615; G11C 11/40618; G11C 11/40622; G11C 2211/4067; G11C 11/40607; G11C 16/107
USPC .................. 711/103, 106, 156, 165, E12.002; 365/185.24, 185.29, 218, 222
See application file for complete search history.

(56) References Cited

U.S. PATENT DOCUMENTS

| | | | |
|---|---|---|---|
| 5,715,193 | A | 2/1998 | Norman |
| 5,724,285 | A | 3/1998 | Shinohara |
| 5,963,473 | A | 10/1999 | Norman |
| 6,000,006 | A | 12/1999 | Bruce et al. |
| 6,028,794 | A | 2/2000 | Nakai et al. |
| 6,240,032 | B1 | 5/2001 | Fukumoto |
| 6,249,838 | B1 | 6/2001 | Kon |
| 6,480,416 | B2 | 11/2002 | Katayama et al. |
| 6,493,270 | B2 | 12/2002 | Chevallier |
| 6,636,937 | B2 | 10/2003 | Peter |
| 6,639,839 | B1 | 10/2003 | Chou et al. |

*Primary Examiner* — Jasmine Song

(74) *Attorney, Agent, or Firm* — Dickstein Shapiro LLP

(57) ABSTRACT

A method and apparatus for refreshing data in a flash memory device is disclosed. A counter is maintained for each memory block. When a memory block is erased, the counter for that erase block is set to a predetermined value while the remaining counters for other erase blocks are changed. When a memory block counter reaches a predetermined threshold value, the associated memory block is refreshed.

20 Claims, 5 Drawing Sheets

hereby incorporated by reference omitted …

REFRESH ALGORITHM FOR MEMORIES

CROSS REFERENCE TO RELATED APPLICATIONS

This application is a continuation of application Ser. No. 12/976,454, filed Dec. 22, 2010, which is a continuation of application Ser. No. 11/987,987, filed Dec. 6, 2007, now U.S. Pat. No. 7,870,330, which is a divisional application of application Ser. No. 11/062,768, filed Feb. 22, 2005, now U.S. Pat. No. 7,325,089, which is a continuation of application Ser. No. 09/941,763, filed Aug. 30, 2001, now U.S. Pat. No. 6,931,480, all of which are hereby incorporated by reference in their entireties.

FIELD OF THE INVENTION

The present invention relates generally to memory devices, and, more particularly, to a method and apparatus for refreshing data stored in flash memory cells.

BACKGROUND OF THE INVENTION

Flash memory is a type of nonvolatile memory that can be erased in units of memory called blocks and programmed in bytes. Flash chips are divided into a plurality of main blocks. Each main block is physically isolated from each other main block. The main blocks are further divided into erase blocks. An erase block is also subdivided into sectors which contain bytes. An erase block may contain, for example, 128 sectors each comprising 512 bytes. All of the erase blocks within a main block share a common bit line.

As a result of the architecture of erase blocks, high voltages are required for programming. When a sector is programmed, the high voltages disturb the data stored in the erase blocks within the same main block. This may cause the data in the other erase blocks of the same main block to become corrupted.

Solutions to the disturb effect include both design solutions and algorithmic solutions. One such design solution is to reduce the number of erase blocks in each main block. Since only the data in erase blocks of the same main block is disturbed during programming, reducing the number of erase blocks in each main block reduces the number of erase blocks that are disturbed while programming an erase block. In addition, as a result of a flash chip having more main blocks, there are fewer programs executed in each main block. Both of these factors decrease the disturb effect.

However, increasing the number of main blocks also increases the resources necessary to operate the flash memory. All of the erase blocks within the same main block share certain resources (i.e. a bit line) necessary for reading and writing data. If fewer erase blocks are in each main block, these resources must be duplicated to a greater degree. As a result, the design of a flash chip becomes more complicated and less cost-effective. In addition, more of the space on the flash chip is consumed by the resources to allow the reading and writing of data. Accordingly, there is less space for data to be stored.

One algorithmic solution to the disturb effect is to alternate which erase blocks within a main block are erased and programmed. After an erase block is erased and programmed, it is not erased and programmed again until every other erase block in that main block is erased and programmed. For example, if a main block contains four erase blocks, once erase block 1 is erased and programmed, erase block 1 is not erased and programmed until erase blocks 2, 3 and 4 are erased and programmed.

BRIEF SUMMARY OF THE INVENTION

The present invention mitigates the problems associated with the prior art and provides a unique method and apparatus for refreshing data stored in a flash memory device.

In accordance with an exemplary embodiment of the present invention, a counter is maintained for each erase block of a flash memory device. When a erase block is erased, the counter for that erase block is set to a predetermined value while the counters for the other erase blocks are incremented. When a counter reaches a predetermined threshold, the data stored in the corresponding erase block is refreshed. Counters are maintained in a table with eight byte entries. Five bytes from three table entries constitute the counters for eight erase blocks. One bit from each of the fifteen bytes comprises each counter.

An algorithm that periodically refreshes data in erase blocks is desirable.

BRIEF DESCRIPTION OF THE DRAWINGS

The above and other features and advantages of the invention will be more readily understood from the following detailed description of the invention which is provided in connection with the accompanying drawings.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to make and use the invention, and it is to be understood that structural changes may be made and equivalent structures substituted for those shown without departing from the spirit and scope of the present invention.

Figure 2:
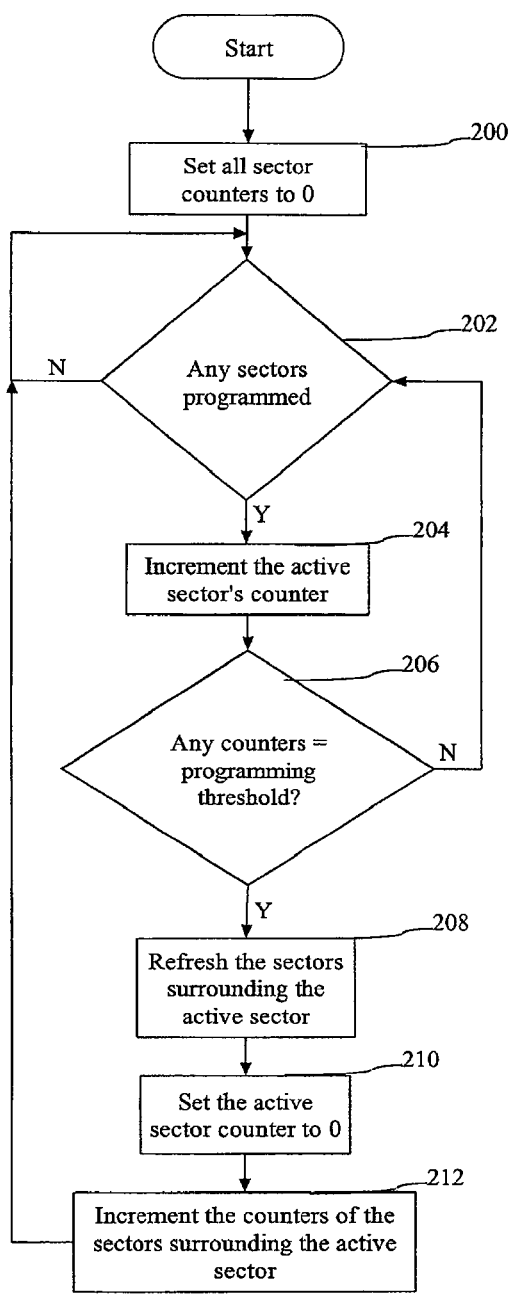
FIG. 2 is a flowchart of an exemplary embodiment of the present invention.

FIG. 2 shows an exemplary embodiment of the present invention. A solution to the disturb effect in which data is refreshed based on the number of times sectors are programmed is illustrated. Since it takes more than one programming operation to corrupt the data in the other erase blocks of the same main block, periodically refreshing the data obviates the problem.

Figure 1:
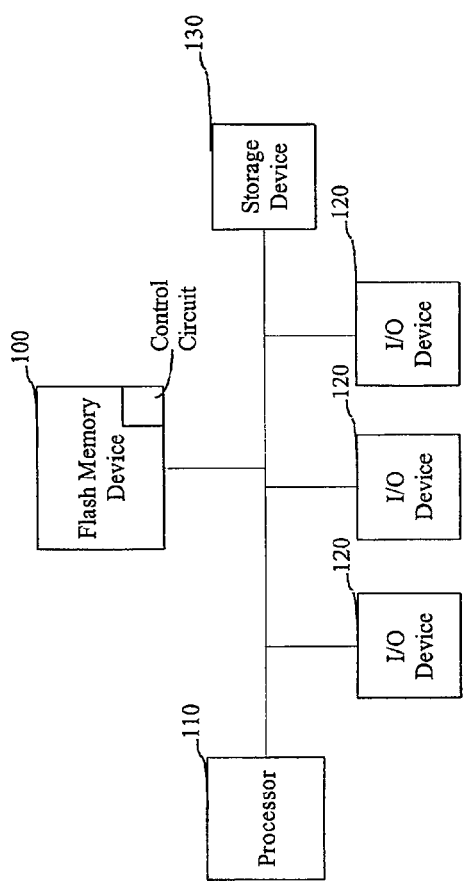
FIG. 1 is a processor circuit which utilizes a flash memory device constructed either in accordance with the prior art or in accordance with the present invention.

Refreshing data, however, creates dead time when the flash memory device is inaccessible to the host system. Consequently, refresh algorithms have been developed to optimize the frequency with which erase blocks are refreshed. For example, flash memory device 100, as illustrated in FIG. 1, may implement the refresh algorithm illustrated in FIG. 2.

Initially, the counters for each sector in flash memory device 100 are set to a predetermined value in segment 200. This predetermined value will generally be zero. After the counters are all set to the predetermined value in segment 200, the control circuit in flash memory 100 checks if a sector was programmed in processing segment 202. If a sector was not programmed in processing segment 202, the control circuit in flash memory 100 continues checking if a sector was programmed.

If a sector was programmed, as detected in processing segment 202, the control circuit in flash memory 100 increments the programmed sector's counter in segment 204. The control circuit in flash memory 100 then determines whether any sector counters equal or exceed a predetermined threshold at processing segment 206. The predetermined threshold is set in the software. This threshold will vary for each type of flash memory device depending on many factors that effect how many times nearby sectors can be programmed without corrupting data. Alternatively, counters can be decremented until they equal or are less than a predetermined threshold.

If none of the sector counters equal or exceed the predetermined threshold, as detected at processing segment 206, the control circuit in flash memory 100 returns to processing segment 202 to determine if any sectors have been programmed.

If a sector counter equals or exceeds the predetermined threshold as detected at processing segment 206, as detected at processing segment 206, the control circuit in flash memory 100 initiates a refresh operation for the nearby sectors. The control circuit in flash memory 100 reads the information in each surrounding sector and rewrites the information in segment 208. The counter for the active sector is then set to the predetermined value in segment 210. Finally, the counters for each refreshed sector are incremented in segment 212.

This method requires maintaining counters for each sector of each block. Most flash memories have 128 sectors per erase block. Not only do the counters take up storage space that could be used for memory storage, but due to the large number of counters, the process of determining which sector counter to increment is arduous.

Figure 3:
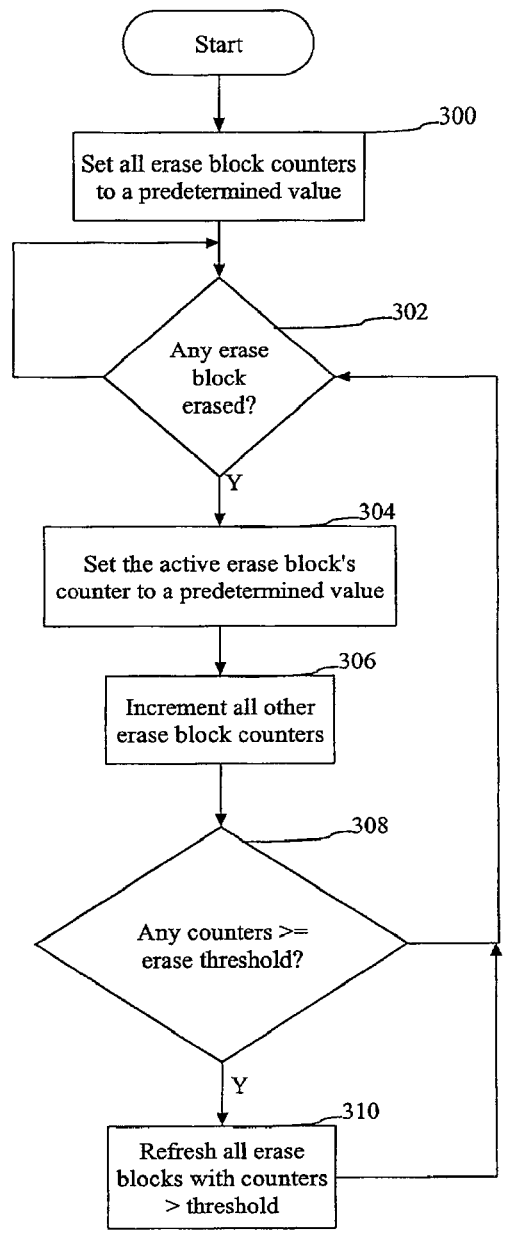
FIG. 3 is a flowchart of another exemplary embodiment of the present invention.

FIG. 3 shows another exemplary embodiment of the present invention. FIG. 3 differs from FIG. 2 in that there is only one counter per erase block instead of a counter for each sector in each erase block. This dramatically reduces the space used for counters.

In addition, instead of incrementing a counter for a sector each time a neighboring sector is written to, each time an erase block is erased, the counters for all of the erase blocks in the same main block are incremented.

Initially, the counters for all of the erase blocks in flash memory 100 are set to a predetermined value at segment 300. When an erase block is erased, as determined in processing segment 302, the control circuit in flash memory 100 resets the active erase block's counter to a predetermined value at segment 304 and increments all erase block counters respectively associated with the non-erased blocks in the same main block at segment 306. The control circuit in flash memory 100 then checks if any of the erase block counters equal or exceed a predetermined threshold at processing segment 308. The control circuit in flash memory 100 then refreshes all erase blocks with counters that equal or exceed the predetermined threshold.

Figure 4:
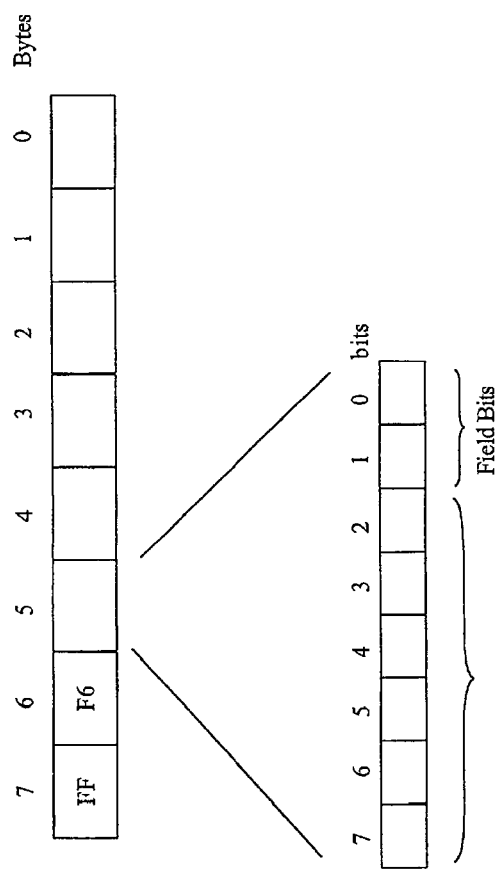
FIG. 4 is a block diagram of an entry in a table used for storing counters.

The counters are stored in a table format in the flash memory. Each entry in the table, as depicted in FIG. 4; is 8-bytes. Each 8-byte entry is divided into three parts. The two most significant bytes of an 8-byte entry are always set to 'FF' (11111111) and 'F6' (11110110) to distinguish between refresh counters and other information present in the table.

The next most significant byte of an 8-byte entry is further divided into two parts. The first part, the two least significant bits, indicate whether the 8-byte entry contains the 5 most significant bits, 5 middle bits or 5 least significant bits of each of the 15 bit counters. Accordingly, these two bits can be set to 00, 01 or 10. The remaining 6 bits indicate which main block this 8-byte entry corresponds to. For example, if a flash memory has 32 erase blocks, those 32 erase blocks could be divided into 8 main blocks, each containing 4 erase blocks. A byte that contains the middle 5 counter bits for the second main block would appear as follows: 00001001. The value in the two least significant bits is set to 01 to indicate that the byte contains the middle bits (00=5 least significant bits; 01=5 middle bits; and 10=5 most significant bits). The value in the 6 most significant bits is set to a value of 2 to indicate that this byte corresponds to the second main block. Accordingly, there would be two additional 8-byte entries in the table where the 6 most cant bits of the third most significant byte are set to a value of 2. One entry will have the two least significant bits of the third most significant byte set to 00, to indicate that it contains the 5 least significant bits of the counters corresponding to the second main block, and the other entry will have the two least significant bits of the third most significant byte set to 10 to indicate that it contains the 5 most significant bits of the counters corresponding to the second main block. Additionally, there will be three 8-byte table entries for each of the other erase block.

Figure 5:
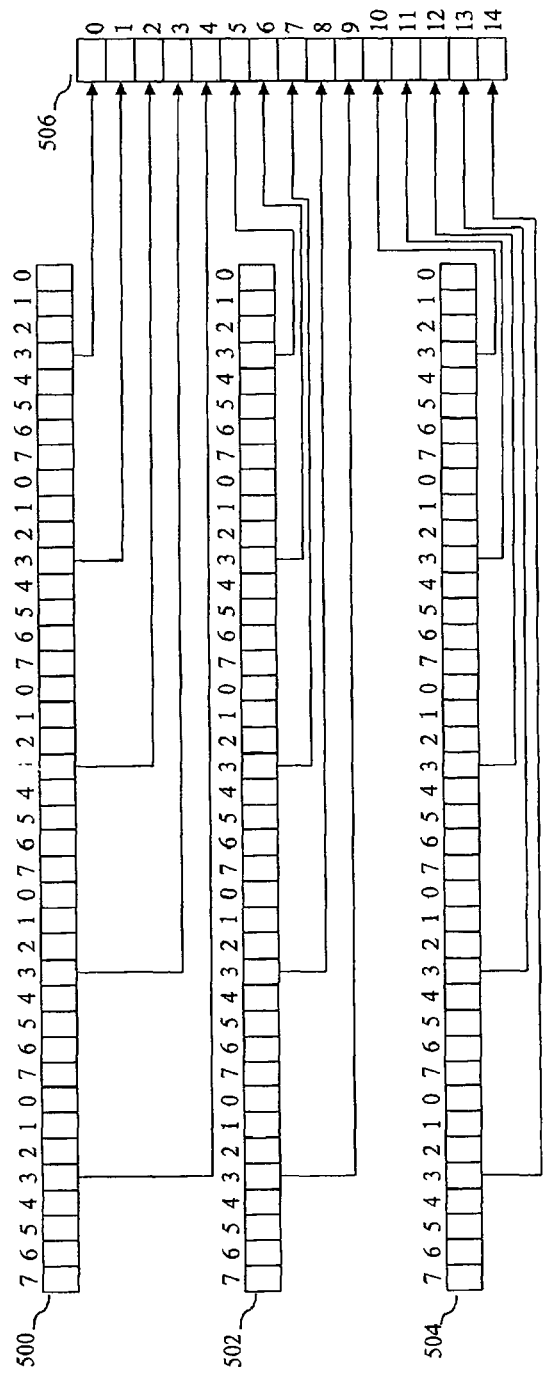
FIG. 5 is a block diagram of a counter for an erase block.

The 5 least significant bytes of each table entry contain the counters. Each of these 5 bytes contains one bit of a 15-bit counter for each of 8 erase blocks. Each counter is a 15 bit value, so it is distributed across 3 table entries 500, 502 and 504, as shown in FIG. 5. One bit from each byte corresponds to counter 506, e.g. the five least significant bits of the counter for erase block 3 506 come from table entry 500, the five middle bits of the counter for erase block 3 506 come from table entry 502 and the five most significant bits for erase block 3 506 come from table entry 504. For example, as shown in FIG. 5, the counter for erase block 3 506 is comprised of the bit 3 of each byte. Similarly, for the first erase block within a group of 8 erase blocks, the least significant bit of each byte compose the counter.

If an erase block contains user data, when that erase block is refreshed, the data is moved to a new location, that is, the data is moved and then the block is erased. By moving the data to a new location, it can be written to and read from the new location. If an erase block contains system data, such as the firmware or a BIOS, the contents refreshed "in place." The contents of the erase block are read into a temporary memory, checked for data integrity, and rewritten over the original data in its original location.

When multiple counters equal or exceed the predetermined threshold value simultaneously, flash memory device 100 may appear busy to processor 110 for an extended period of time. Since this situation is undesirable, the time spent refreshing multiple erase block can be hidden from processor 110 by allowing processor 110 to continue accessing flash memory device 100 between refresh operations. Each erase block that requires refreshing is refreshed after an operation initiated by processor 110, such as, for example, write operations. As a result, instead of using 100% of flash memory 100's capacity during multiple refreshes, and interfering with any other operations being performed by processor 110, each operation that processor 110 performs will take a little longer to complete while a single erase block is refreshed, but the flash memory device being refreshed will be accessible to processor 110 during the refreshes.

While the invention has been described with reference to exemplary embodiments various additions, deletions, substitutions, or other modifications may be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A memory device, comprising:
   at least one main memory block comprising a plurality of erase blocks;
   a control circuit configured to control erasing of the main memory block, the control circuit being configured, in response to an erasing of a first erase block of the main block, to set a count associated with the first erase block to a particular value and change a count associated with another erase block of the main block; and
   refresh the other erase block in response to the count associated with the other erase block reaching a threshold, wherein the refresh of the other erase block comprises:
   moving user data contained in the other erase block to a new location, if the other erase block contains user data when the other erase block is refreshed; and
   refreshing system data contained in the other erase block in place.

2. The memory device of claim 1, wherein the change of a count associated with another erase block of the main block comprises changing counts associated with all other erase blocks of the main block.

3. The memory device of claim 2, wherein the control circuit is configured to initially set all of the counts associated with the erase blocks of the main block to the particular value, and wherein the setting of the count associated with the first erase block comprises resetting the count associated with the first erase block to the particular value.

4. The memory device of claim 1, wherein the change of a count associated with another erase block of the main block comprises incrementing the count associated with the other erase block.

5. The memory device of claim 4, wherein the refreshing of the other erase block in response to the other erase block reaching a threshold further comprises refreshing the other erase block if the count associated with the other erase block is equal to or exceeds the threshold.

6. The memory device of claim 1, wherein the change of a count associated with another erase block of the main block comprises decrementing the count associated with the other erase block.

7. The memory device of claim 1, wherein the other erase block contains system data, and the refreshing of the system data contained in the other erase block in place comprises:
   reading system data contained in the other erase block; and
   rewriting the system data in the other erase block.

8. The memory device of claim 1, wherein the refresh of the other erase block further comprises checking the integrity of the system data.

9. A memory device comprising:
   at least one main memory block comprising a plurality of erase blocks; and
   a control circuit configured to control erasing of the at least one main memory block, said control circuit being configured to:
   determine a type of data in an erase block to be refreshed, wherein the type comprises one of user data and system data;
   if the erase block is determined to contain user data, move the user data to a new location when the erase block is refreshed; and
   if the erase block is determined to contain system data, rewrite the system data in the erase block when the erase block is refreshed.

10. A memory device comprising:
    a plurality of sectors within an erase bock of the memory device; and
    a control circuit configured to:
    responsive to the programming of a sector, change a count associated with the programmed sector; and
    refresh sectors near the programmed sector and not refresh the programmed sector in response to the count associated with the programmed sector reaching a threshold;
    wherein refreshing sectors comprises reading any data contained in the sectors and rewriting the data contained in the sectors to a new location.

11. The memory device of claim 10, wherein the control circuit is further configured to set the count associated with the programmed sector to a particular value responsive to refreshing one of the sectors near the programmed sector.

12. The memory device of claim 11, wherein the control circuit is further configured to change the count of the one of the sectors near the programmed sector responsive to refreshing the one of the sectors near the programmed sector.

13. The memory device of claim 11, wherein the control circuit is further configured to initially set all sectors of the erase block to the particular value, and
    wherein the setting the count associated with the programmed sector comprises resetting the count associated with the programmed sector to the particular value.

14. The memory device of claim 10, wherein the control circuit is configured to set the threshold.

15. The memory device of claim 10, wherein the refresh of sectors near the programmed sector comprises refreshing sectors surrounding the programmed sector.

16. The memory device of claim 10, wherein the change of a count comprises incrementing the count associated with the programmed sector.

17. The memory device of claim 16, wherein the refresh of sectors near the programmed sector in response to the count associated with the programmed sector reaching a threshold comprises refreshing the sectors near the programmed sector responsive to the count associated with the programmed sector equaling or exceeding the threshold.

18. The memory device of claim 10, wherein the change of a count comprises decrementing the count associated with the programmed sector.

19. The memory device of claim 18, wherein the refresh of sectors near the programmed sector in response to the count associated with the programmed sector reaching a threshold comprises refreshing the sectors near the programmed sector responsive to the count associated with the programmed sector equaling or being less than the threshold.

20. The memory device of claim 10, wherein the control circuit is further configured such that when counts associated with multiple sectors reach the threshold simultaneously, the refreshing of sectors near the programmed sector comprises refresh of sectors near the programmed sector after an operation initiated by a processor.

* * * * *

UNITED STATES PATENT AND TRADEMARK OFFICE
CERTIFICATE OF CORRECTION

PATENT NO.        : 8,918,584 B2                                                              Page 1 of 1
APPLICATION NO.   : 14/151095
DATED             : December 23, 2014
INVENTOR(S)       : Shuba Swaminathan It is certified that error appears in the above-identified patent and that said Letters Patent is hereby corrected as shown below:

On the title page, item (60), under "Related U.S. Application Data", in column 1, line 2, delete "and" and insert -- which is --, therefor.

On the title page, item (60), under "Related U.S. Application Data", in column 1, line 4, delete "and" and insert -- which is --, therefor.

On the title page, item (60), under "Related U.S. Application Data", in column 1, line 6, delete "and" and insert -- which is --, therefor.

Signed and Sealed this
Twenty-fourth Day of March, 2015

Michelle K. Lee
*Director of the United States Patent and Trademark Office*